United States Patent
Han et al.

[11] Patent Number: 5,851,914
[45] Date of Patent: Dec. 22, 1998

[54] METHOD OF FABRICATING A METAL CONTACT STRUCTURE

[75] Inventors: Sang Jun Han; Won Taik Kwon; Jeong Hoe Kim, all of Bubaleub, Rep. of Korea

[73] Assignee: Hyundai Electronics Industries Co., Ltd., Rep. of Korea

[21] Appl. No.: 842,038

[22] Filed: Apr. 23, 1997

[30] Foreign Application Priority Data

Jun. 29, 1996 [KR] Rep. of Korea ................... 1996-26552

[51] Int. Cl.$^6$ ..................................................... H01L 21/28
[52] U.S. Cl. .......................... 438/622; 438/624; 438/639; 438/647
[58] Field of Search ........................... 438/622, 624, 438/647, 634, 926, 639

[56] References Cited

U.S. PATENT DOCUMENTS

| | | | |
|---|---|---|---|
| 4,800,177 | 1/1989 | Nakamae | 438/627 |
| 5,174,858 | 12/1992 | Yamamoto et al. | 438/301 |
| 5,258,096 | 11/1993 | Sandhu et al. | 438/621 |
| 5,525,552 | 6/1996 | Huang | 437/41 |

*Primary Examiner*—T. N. Quach
*Attorney, Agent, or Firm*—Blakely Sokoloff Taylor & Zafman

[57] ABSTRACT

A method for fabricating a metal contact structure of semiconductor devices comprising forming a first conducting layer; a first insulating layer disposed on said first conducting layer; a first contact hole to said first conducting layer; wherein said first contact hole is formed in said first insulating layer; dummy conducting patterns formed in said first contact hole, wherein said conducting dummy patterns are contacted with said first conducting layer through said first contact hole, and said dummy film is partly overlapped on the said first insulating layer; a second insulating layer disposed on said first insulating layer; a second contact hole, wherein said second contact hole is formed in said second insulating layer, and wherein said first contact hole and said second contact hole substantially form a through-hole; and a second conducting layer disposed on said second insulating layer which is contacted to said dummy conducting patterns through said second contact hole.

5 Claims, 8 Drawing Sheets

METHOD OF FABRICATING A METAL CONTACT STRUCTURE

BACKGROUND OF THE INVENTION

1. Field of the Invention

The present invention relates to a metal contact structure of semiconductor devices, and more particularly to an improved contact structure having a buffered polysilicon layer for metal contacts of semiconductor devices, and a method of fabricating the same.

2. Description of the Related Art

In the manufacture of semiconductor integrated circuits, a thin metal coating is deposited and patterned to create an interconnection between each of the devices. The contact structure consisting of a metal film deposited onto contact holes was adopted in the earliest stages of the silicon technology. As the circuit density has increased, the opening area of contact hole has been subsequently reduced, but the thickness of the interlayer insulating film between the deposited metal layer and the conducting layer has not varied in proportion to a scaling parameter. The depth of the contact holes has not been scaled down according to the area reduction of the contact opening.

Thereby, a step coverage problem at near vertical steps or sidewalls occurs. Thin metal layers at these steps or sidewalls result in a higher resistance and a propensity for electromigration failures. In the prior arts, to improve the step coverage of the wiring metal film, the steepness of the sidewall of the through-hole for contacts has been minimized by a wet/dry etch process.

Disclosed is a method of making a contact-hole for metal interconnections consisting of a through-hole having a large opening area and of a through-hole having a small opening area. In the above prior art, the etching process comprises two steps: isotropic wet etching of the first interlayer insulating film to form a through-hole having a large opening area, and an anisotropic dry etching step to form a through-hole having a small opening area.

The aluminum (Al) film is widely used as a metal layer for interconnection in a silicon integrated circuit. However, the Al-to-silicon contact exhibits some poor contact characteristics. Since the diffusivity of Al to the silicon is high at a contact-alloying temperature between 450° to 500° C., the Al film absorbs the silicon of the contact region and Al atoms diffuse into the silicon layer during the contact-alloying process. The experimental data show that Al film absorbs 0.5 to 1 percent silicon from the junction during the alloying process. If the penetration depth of the Al is deeper than the junction width below the contact, the junction is electrically shorted. This effect is referred to as junction spiking.

To prevent junction spiking to the thin diffusion layer, a diffusion barrier has been formed between the overlying metal layer and the underlying silicon diffusion layer. A refractory metal nitride film deposited at a temperature of 600° C. has been used as a barrier metal material for silicon devices.

Referring to FIG. 1A through 1H of the drawings, an example of conventional process steps for metal contact of semiconductor memory devices having stacked capacitor storage cells is described. These conventional process steps have been used for fabricating metal contact for the word line strapping in the core cell area and metal contact of the peripheral circuit area of semiconductor memory devices having stacked storage capacitor cells.

The process steps in accordance with the prior art are as followings: Firstly, forming an oxide layer 12 on a silicon substrate having a conducting layer 11, as shown in FIG. 1A. A polysilicon layer 13 is deposited on the oxide layer 12. In order to form a sidewall of a cylindrical stacked capacitor in the cells (not shown in the drawings) of dynamic memory devices, the polysilicon layer 13 is etched by the anisotropic etching method. (The sidewall formation is not shown in the drawings.) The polysilicon layer 13 in the word line strapping region and the peripheral region is removed at this etching step, as shown in FIG. 1B.

Subsequently, an oxide layer 14 used as an interlayer insulating film is formed on the oxide layer 12 and photo resist patterns 15 are formed on the oxide layer 14.

Then, the oxide layer in the contact region is etched isotropically with the wet oxide etching process by a predetermined thickness using the photo resist patterns 15 as a mask, as shown in FIG. 1D.

The remaining part of the oxide layer is removed with the anisotropic dry etching process by also using the photo resist patterns 15 as a mask, so that a contact hole 16 is formed completely, as shown in FIG. 1E.

The photo resist patterns 15 are removed after the etching steps. A barrier metal layer 17, such as a refractory metal nitride film, is deposited on the whole surface including the oxide layers 12, 14 and the contact hole 16, as shown in FIG. 1F.

Subsequently, a metal layer 18 for interconnection is deposited on the barrier metal layer 17, as shown is FIG 1G.

The two step wet/dry etching for contact holes produces sloping sides to reduce the metal thinning at the corner edge of the upper end of the vertical-wall of the contact holes, thereby the step coverage of the metal layer 18 is improved.

But, in conventional methods for forming the contact hole, the barrier metal layer 17 should be deposited before the metal layer 18 formation to prevent junction spiking and to improve the reliability of semiconductor devices.

The disadvantage of the conventional fabrication method is the complexity of the processing steps. Since the depth of the contact hole 16 is deep and the reflow characteristics of the metal formed through the contact hole is not good enough, the metal contacts of semiconductor devices, in prior arts, necessities described complex process steps including wet/dry etching and barrier metal formation before metal deposition. The present invention will show a simple and more cost effective process for metal contact of the semiconductor devices. In accordance with the preferred embodiments, of the invention, a method for fabricating an improved metal contact structure of the semiconductor devices is provided.

SUMMARY OF THE INVENTION

It is therefore an object of the invention to provide an improved metal contact structure of semiconductor devices by introducing an interlayer dummy conducting film or a buffered polysilicon layer.

Another object of this invention is to provide an improved method for fabricating a semiconductor metal contact by reducing the depth of the effective contact hole for metal interconnections.

Another object of this invention is to provide an improved method for fabricating a semiconductor metal contact that reduces the complexity of the processing steps by eliminating both of the process steps for wet etching of an insulating layer and formation of a barrier metal layer.

The objects and features of the invention are achieved by providing an improved structure of metal contact and by providing methods for fabrication thereof depicted in the detailed description of the preferred embodiments. The contact structure of semiconductor devices comprising: a first conducting layer; a first insulating layer disposed on said first conducting layer; a first contact hole to said first conducting layer; wherein said first contact hole is formed in said first insulating layer; dummy conducting patterns formed in said first contact hole, wherein said conducting dummy patterns are contacted with said first conducting layer through said first contact hole, and said dummy film is partly overlapped on the said first insulating layer; a second insulating layer disposed on said first insulating layer; a second contact hole, wherein said second contact hole is formed in said second insulating layer, and wherein said first contact hole and said second hole substantially form a through-hole; and a second conducting layer disposed on said second insulating layer which is contacted to said dummy conducting patterns through said second contact hole.

Also, in another aspect of the present invention, there is disclosed a method for fabricating a contact structure of semiconductor devices, comprising the steps of: preparing a first conducting layer on a substrate; forming a first insulating layer on said substrate; opening a first contact hole in the specific region of said first insulating layer; depositing a dummy conducting film on the whole surface of said first insulating layer and said first contact hole; patterning said dummy conducting film to form dummy conducting patterns, wherein said dummy conducting patterns cover the whole surface of said contact hole and overlaps a part of said first insulating layer; forming a second insulating layer on the surface of said first insulating layer and on said dummy conducting patterns; etching said second insulating layer to form a second contact hole, wherein said first contact hole and said second contact hole substantially form a through-hole; and depositing a second conducting layer to form a metal contact to said dummy conducting patterns through said second contact hole.

BRIEF DESCRIPTION OF THE DRAWINGS

These and other objects, and features and advantages of the present invention, as well as the invention itself, will become better understood by reference to the following detailed description of the preferred embodiments when considered in conjunction with the accompanying drawings, wherein.

DETAILED DESCRIPTION OF THE PREFERRED EMBODIMENTS

Hereinafter, the present invention will be described in detail referring to accompanying drawings.

Figure 1A:
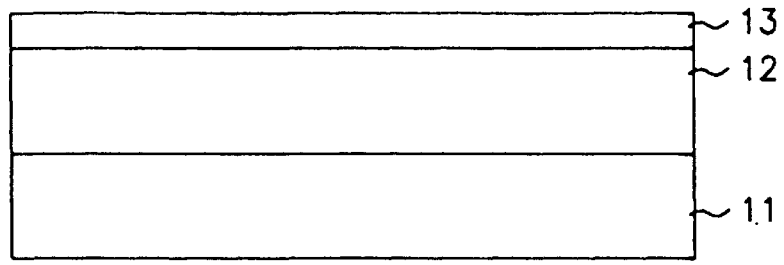
FIGS. 1A through 1G are cross sectional views illustrating the conventional fabrication sequence used to form a contact structure of semiconductor devices.
Figure 1B:
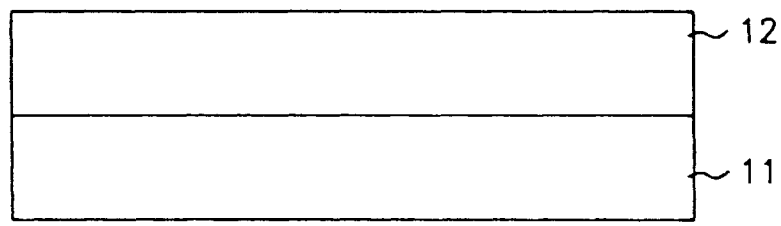
Figure 1C:
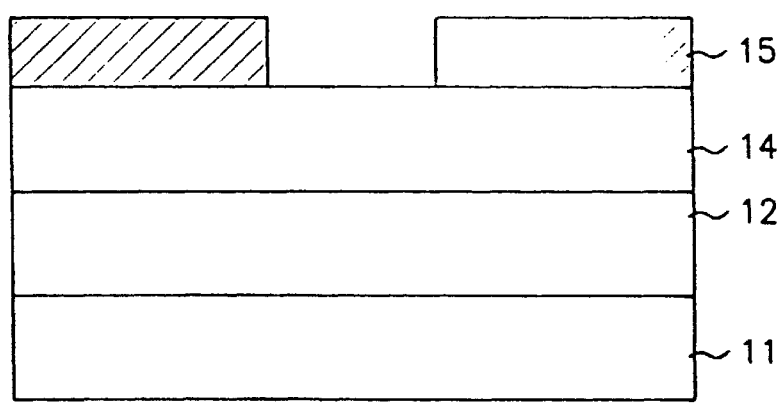
Figure 1D:
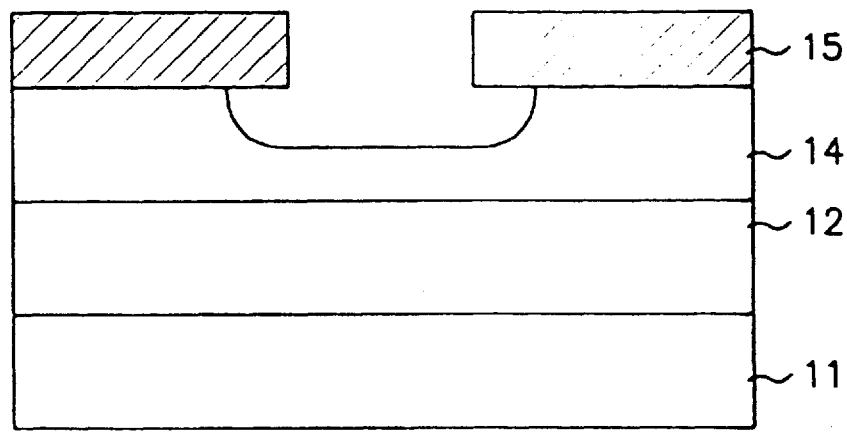
Figure 1E:
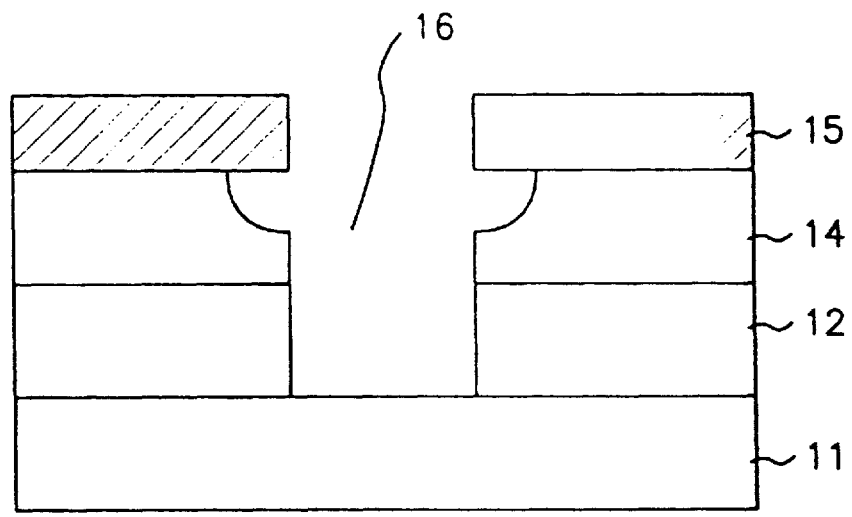
Figure 1F:
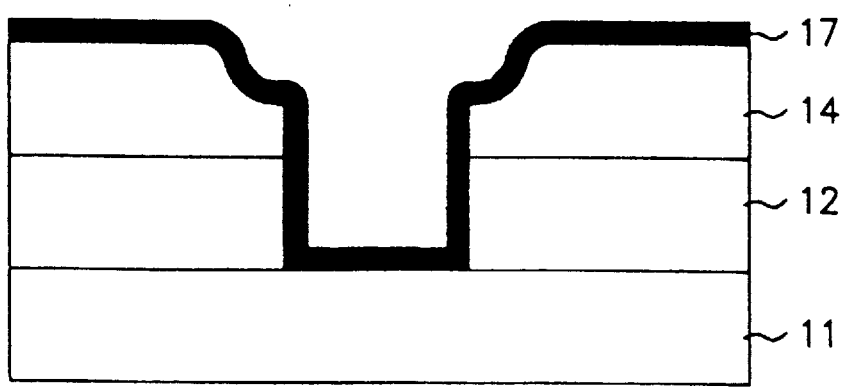
Figure 1G:
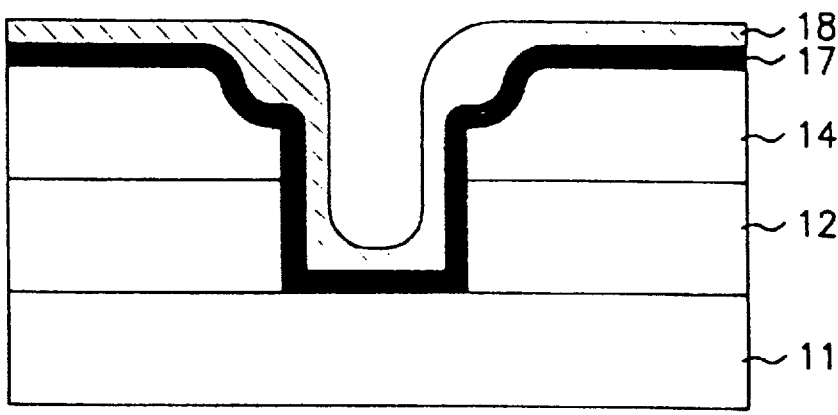
Figure 2:
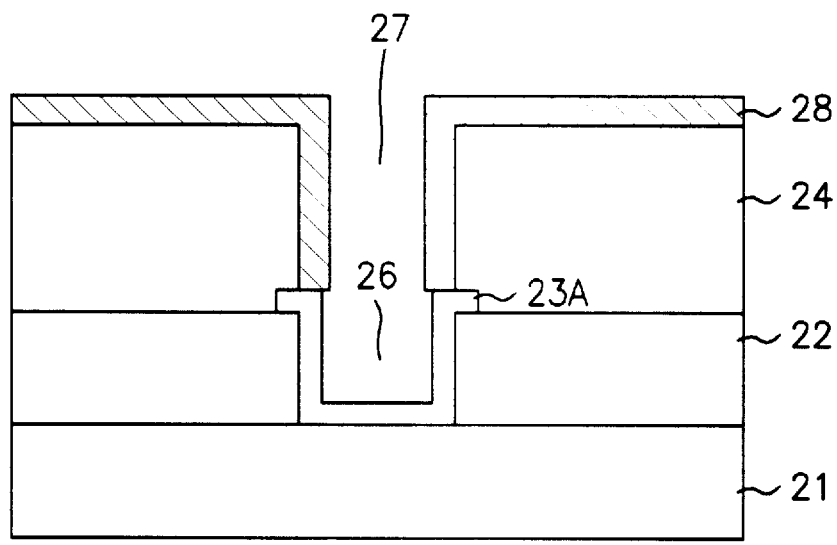
FIG. 2 is a cross sectional views illustrating a contact structure of semiconductor devices according to the present invention.

FIG. 2 is a cross sectional view illustrating the preferred an embodiment in this invention. The contact structure of semiconductor devices of the preferred embodiments consists of a conducting layer 21, an insulating layer 22 disposed on the conducting layer 21, a contact hole 26 formed on the conducting layer 21 layer through the insulating layer 22, dummy conducting patterns 23A partly overlapped on the insulating layer 22, wherein the dummy conducting patterns 23A are contacted with the conducting layer 21 through the contact hole 26, an insulating layer 24 disposed on the insulating layer 22, a contact hole 27 formed on the dummy conducting patterns 23A through the insulating layer 24, wherein the contact hole 26 and the contact hole 27 substantially form a through-hole, and a conducting layer 28 disposed on the insulating layer 24 contacted to the dummy conducting patterns 23A through the contact hole 27.

The conducting layer 21 is preferably a doped polysilicon layer used as a word line in semiconductor memory chips, or a highly doped diffusion junction used as an electrode of devices in semiconductor integrated circuits.

The method of forming a contact structure of semiconductor devices with an improved process will now be covered in detail. FIGS. 3A to 3G schematically illustrate the process flow for the formation of metal contact structures of the preferred embodiments.

Figure 3A:
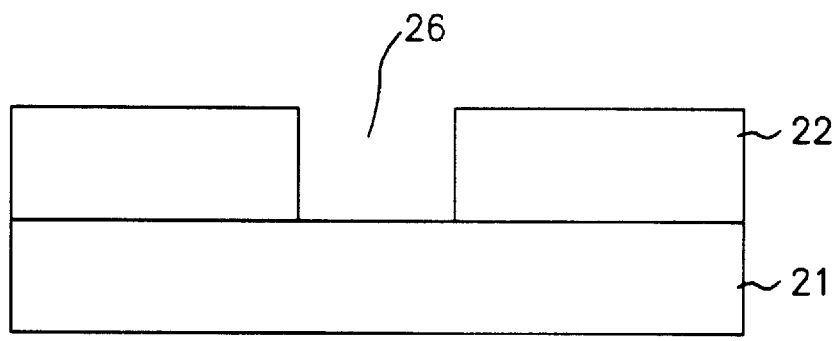
FIGS. 3A through 3G, are cross sectional views illustrating the fabrication sequence used to form a contact structure of semiconductor devices according to the present invention.

Referring to FIG. 3A, a silicon substrate (not shown) has a conducting layer 21, such as highly doped junctions or a doped polysilicon layer. An insulating layer 22, such as a silicon dioxide layer or silicon nitride layer, is formed on the conducting layer 21 using well known techniques, such as chemical vapor deposition. The region for a contact hole 26 is defined by the well known photo lithographic process, and the insulating layer 22 is selectively removed to form the contact hole 26 using photo resist patterns (not illustrated) as a mask.

Figure 3B:
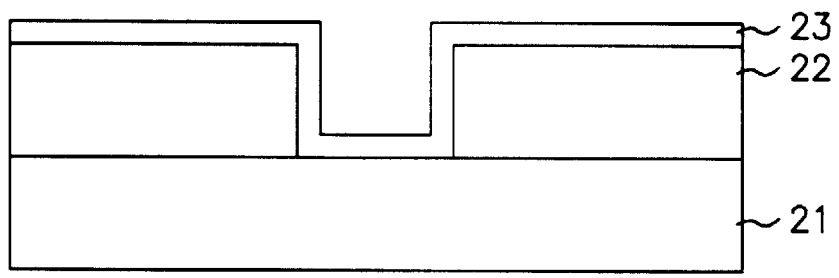

A conducting film 23 is deposited on the top surface of the insulating layer 32 and the sidewalls of the contact hole 26, as shown in FIG. 3B. In this preferred embodiment, the conducting film 23 is a doped polysilicon layer formed by the chemical vapor deposition process.

Figure 3C:
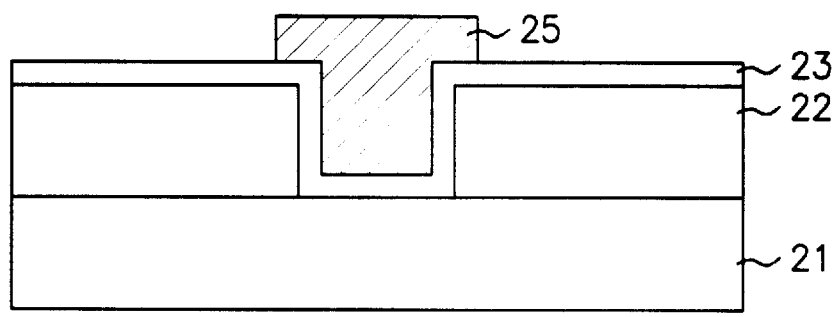

Photo resist patterns 25 are formed on the conducting layer to pattern the conducting film 23, as shown in FIG. 3C.

Figure 3D:
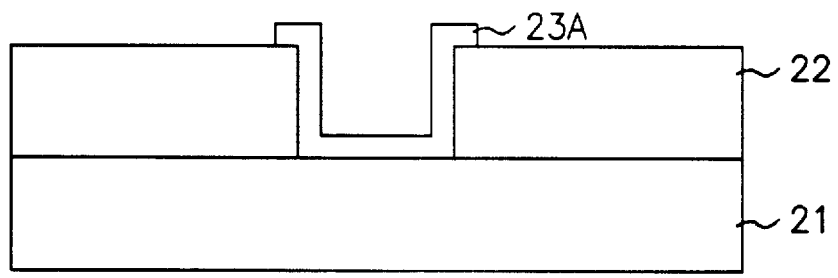

Dummy conducting patterns 23A are formed by the etching process and the photo resist patterns 25 are removed. The dummy conducting patterns 23A cover the whole surface and sidewalls of the contact hole 26 and overlaps with a part of the insulating layer 22, as shown in FIG. 3D.

The important feature of the application of the dummy conducting patterns 23A are that the effective depth of the contact hole 26 in which the wiring metal layer should be filled is reduced. Another important role of the dummy conducting patterns 23A are that they provide a buffer layer preventing junction spiking of Al-to-silicon contacts. Thereby, a barrier metal film between Al film and the silicon layer is not needed.

Figure 3E:
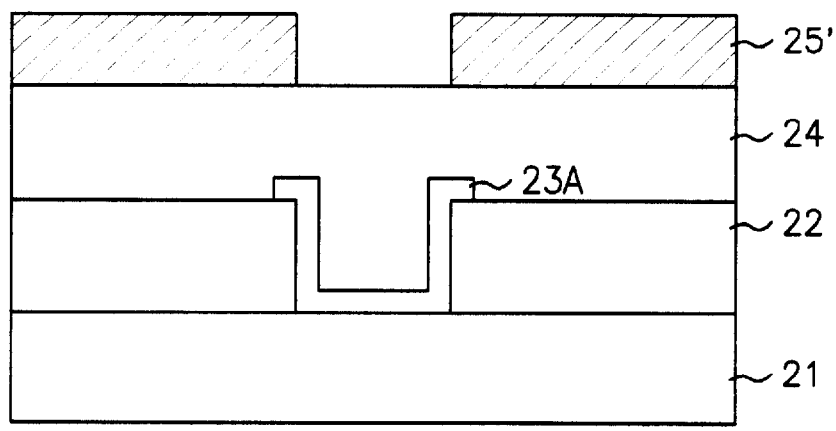

Next, an insulating layer 24 is deposited on the surface of the insulating layer 22 and on the dummy conducting patterns 23A, and thereafter photo resist patterns 25' are formed to define a second contact hole; as shown in FIG. 3E.

Figure 3F:
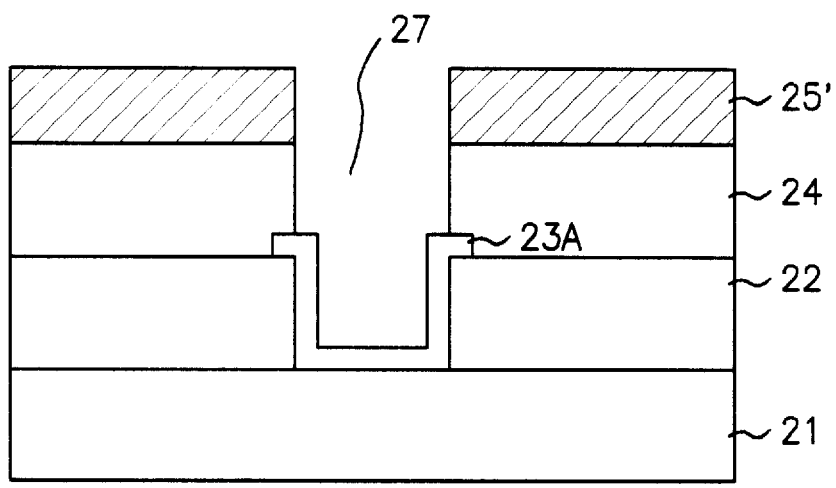

The insulating layer 24 is then selectively removed by the anisotropic dry etching method, such as the reactive ion etch or the plasma etch, using photo resist patterns 25' as an etching mask, as shown in FIG. 3F.

Figure 3G:
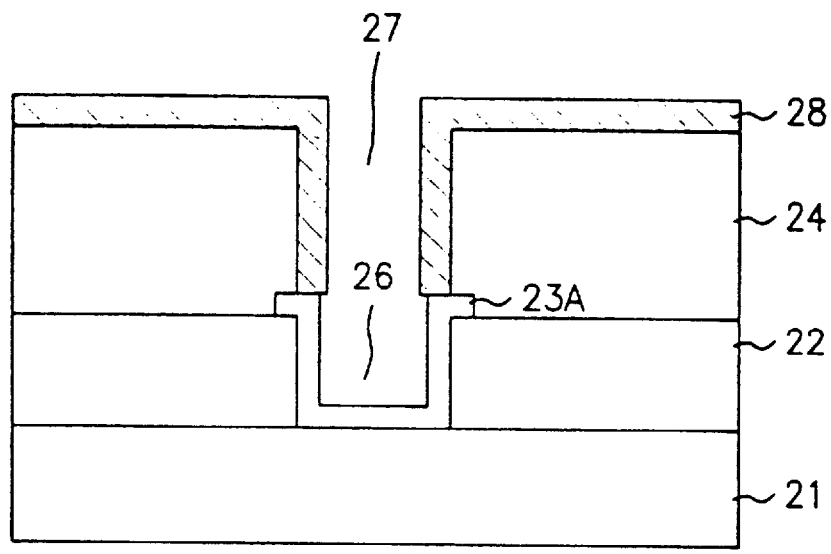

The photo resist patterns 25' are removed after the dry etching step. After the contact hole 27 has been formed, a conducting layer 28, which may comprise an Al film or a silicon doped Al layer, for example, is deposited over the insulating layer 24 and over the whole surface of the contact hole 27. The dummy conducting patterns 23A are connected to the metal layer 28 at this step, as shown in FIG. 3G. It will be apparent that a different working embodiment in a wide range can be formed without deviating from the spirit and the scope of the present invention. For example, when the process steps of this invention are applied to the fabrication of the dynamic memory devices having cylindrical DRAM cells, the above mentioned dummy conducting patterns 23A can be the polysilicon layer deposited to form a sidewall spacer of a cylindrical DRAM cell. Therefore, the present invention is not restricted by the specific embodiments described and illustrated herein except as being limited in the appended claims.

What is claimed is:

1. A method of fabricating a contact structure of semiconductor devices, comprising the steps of:

preparing a first conducting layer on a substrate;

forming a first insulating layer on said substrate and said first conducting layer;

forming a first vertical contact opening exposing a specific region of said first conducting layer, using a first mask, wherein a width of an under portion of said first vertical contact opening is the same as that of the lower portion thereof;

depositing a dummy conducting layer on an upper surface of said first insulating layer and on the sidewalls of said first insulating layer within said first vertical contact opening, to electrically contact said dummy conducting layer with said first conducting layer;

patterning said dummy conducting layer to form a patterned dummy conducting layer, wherein said patterned dummy conducting layer has an extending part positioned on a top surface of said first insulating layer and covers said first vertical contact opening;

forming a second insulating layer on a top surface of said first insulating layer and on said patterned dummy conducting layer;

etching said second insulating layer to form a second vertical contact opening, using a second mask, wherein said second mask is the same as said first mask, and further wherein a width of an upper portion of said second vertical contact opening is the same as that of the lower portion thereof; and depositing a second conducting layer on an upper surface of said second insulating layer and on the sidewalls of said second insulating layer, and on said extending part of said patterned dummy conducting layer, to form a metal contact.

2. The method of claim 1, wherein said first conducting layer is a word line of semiconductor memory devices.

3. The method of claim 2, wherein said second conducting layer is a polysilicon layer.

4. The method of claim 1, wherein said first insulating layer and said second insulating layer are dielectric layers selected from a group consisting of silicon oxide or nitride film.

5. The method of claim 1, wherein said dummy conducting layer is a part of a cylindrical storage electrode of memory device.

* * * * *

UNITED STATES PATENT AND TRADEMARK OFFICE
CERTIFICATE OF CORRECTION

PATENT NO. : 5,851,914
DATED : December 22, 1998
INVENTOR(S) : Han et al.

It is certified that errors appear in the above-identified patent and that said Letters Patent is hereby corrected as shown below:

In column 2, line 47, delete "In accordance with the preferred embodiments, of the invention," and insert -- In accordance with the preferred embodiments of the invention, --.

In column 5, line 22, delete "a width of an under portion" and insert -- a width of an upper portion --.

In column 5, line 23, delete "the lower portion thereof:" and insert -- the lower portion thereof; --.

Signed and Sealed this

Tenth Day of October, 2000

Q. TODD DICKINSON

*Attest:*

*Attesting Officer*          *Director of Patents and Trademarks*